(12) United States Patent
Sin et al.

(10) Patent No.: US 7,224,708 B2
(45) Date of Patent: May 29, 2007

(54) FOCUSED ION BEAM HEATER THERMALLY TUNABLE LASER

(75) Inventors: Yongkun Sin, Torrance, CA (US); Nathan Presser, West Hollywood, CA (US)

(73) Assignee: The Aerospace Corporation, El Segundo, CA (US)

( * ) Notice: Subject to any disclaimer, the term of this patent is extended or adjusted under 35 U.S.C. 154(b) by 263 days.

(21) Appl. No.: 10/929,860

(22) Filed: Aug. 30, 2004

(65) Prior Publication Data

US 2006/0045147 A1  Mar. 2, 2006

(51) Int. Cl.
*H01S 3/04* (2006.01)

(52) U.S. Cl. .......................................... 372/34; 372/20

(58) Field of Classification Search .................. 372/34, 372/20
See application file for complete search history.

(56) References Cited

U.S. PATENT DOCUMENTS 5,536,085 A * 7/1996 Li et al. .................. 372/50.12
2001/0044207 A1 * 11/2001 Marsh ........................ 438/676

* cited by examiner

*Primary Examiner*—Minsun Oh Harvey
*Assistant Examiner*—Tod T. Van Roy
(74) *Attorney, Agent, or Firm*—Derrick Michael Reid

(57) ABSTRACT

Platinum (Pt) thin film heaters are deposited by a focused ion beam for semiconductor manufacturing of thermally tunable distributed feedback lasers. An exemplar 1.3 μm InGaAsP/InP laser is integrated with a tuning element having a wide wavelength tuning range of 4.9 nm, that is, 857 GHz, with a small heater current of 13.0 mA.

13 Claims, 4 Drawing Sheets

FOCUSED ION BEAM HEATER THERMALLY TUNABLE LASER

FOCUSED ION BEAM HEATER THERMALLY TUNABLE LASER

DIMENSION AND CURRENT DEPENDENT LASER DIODE PLOT

CURRENT DEPENDENT THERMALLY TUNABLE LASER
EMISSION SPECTRA PLOT

LASER DIODE CURRENT DEPENDENT POWER PLOT

FOCUSED ION BEAM HEATER THERMALLY TUNABLE LASER

FIELD OF THE INVENTION

The invention relates to the field of tunable lasers. More particularly the present invention is related to tunable lasers with focused ion beam deposited Pt thin film heaters as tuning elements.

BACKGROUND OF THE INVENTION

Long wavelength tunable single-longitudinal-mode lasers have been developed for over a decade mainly for telecommunication applications. Various types of 1.5 µm tunable lasers have been used including distributed Bragg reflector (DBR) lasers, optically or electrically pumped vertical cavity surface emitting lasers (VCSELs) integrated with micro-electro-mechanical system (MEMS), distributed feedback (DFB) laser arrays, and others. Especially, multi-section DBR lasers employing non-uniform grating structures such as super-structure gratings or sampled gratings have shown a wide tuning range by carrier injection. However, the fabrication process steps involved are demanding, and sophisticated control electronics are often required to adjust the currents to different sections, such as, active section, passive DBR section, and phase control section, in order to obtain a wide tuning range and avoid mode hops while maintaining a constant output power.

Even though DFB lasers have shown a narrower tuning range compared to DBR lasers, DFB lasers advantages include a much simpler fabrication process and no need for sophisticated control electronics. Additionally, DFB laser technology is the only technology that is currently mature. Thermal tuning is usually employed for DFB lasers because only a very small tuning is possible by carrier injection due to two adversely competing processes, that is, the thermal effect and plasma effect. There are at least two different techniques to tune DFB lasers thermally using an external thermo-electric cooler (TEC, or Peltier cooler) and using an integrated thin film heater. The first approach requires a lot of power and the tuning speed is very slow because the cooler needs to heat and cool the laser as well as the submount and heat sink. There have been several reports on 1.5 µm InGaAsP/InP DFB and DBR lasers integrated with thin film heaters, but the heater current required to obtain a tuning range of 3.0 nm was 200 mA, which is more than a factor of four higher than the laser operating current to obtain an output power of 5 mW. This high heater current has been an obstacle for these lasers to find practical applications and is due to the low electrical resistance from Pt thin films formed by evaporation processes. Platinum is a metal having inherently low electrical resistance and generally not suitable for use as a heating element. Platinum has been deposited using semiconductor fabrications processes such as evaporation, sputtering, and focused ion beam (FIB). However, FIB deposited platinum is generally not suitable for use in microelectronic devices because of the carbon contamination associated with platinum deposition processes. When depositing platinum using FIB technique, the film shows high electrical resistance and much effort has been devoted to remove contaminating carbon without result. These and other disadvantages of FIB deposited platinum films can be used for the benefit of improving tunable lasers using the invention.

SUMMARY OF THE INVENTION

An object of the invention is to provide a thermal tunable laser using platinum heater.

Another object of the invention is to provide a thermal tunable laser using platinum heater having carbon impurities.

Yet another object of the invention is to provide a thermal tunable laser using platinum heater deposited using a focused ion beam.

Still another object of the invention is to provide a thermal tunable laser using platinum heater integrated by semiconductor manufacturing processes.

A further object of the invention is to provide a thermal tunable laser using platinum heater using low heating current.

Yet a further object of the invention is to provide a thermal tunable laser using platinum heater tunable over a wide wavelength range.

The invention is directed to tunable lasers with focused ion beam deposited Pt thin film heaters as tuning elements. In the exemplar for, a focus ion beam (FIB) is used to deposit a heater as an efficient tuning element to realize tunable lasers. Discovery is made that normally unwanted carbon contamination is useful in providing high resistance for efficient generation of thermal energy for heating a tunable laser, that is, metal-organic precursors used in a FIB deposition process produces high electrical resistance film containing a large number of carbon, that is well suited for thermal heater fabrication. In the preferred form, a 1.3 µm InGaAsP/InP DFB laser includes a platinum heater. The integrated laser has a wavelength tuning range of 4.9 nm, or 857 GHz using a very low heater current of 13 mA. These and other advantages will become more apparent from the following detailed description of the preferred embodiment.

DETAILED DESCRIPTION OF THE PREFERRED EMBODIMENT

Figure 1:
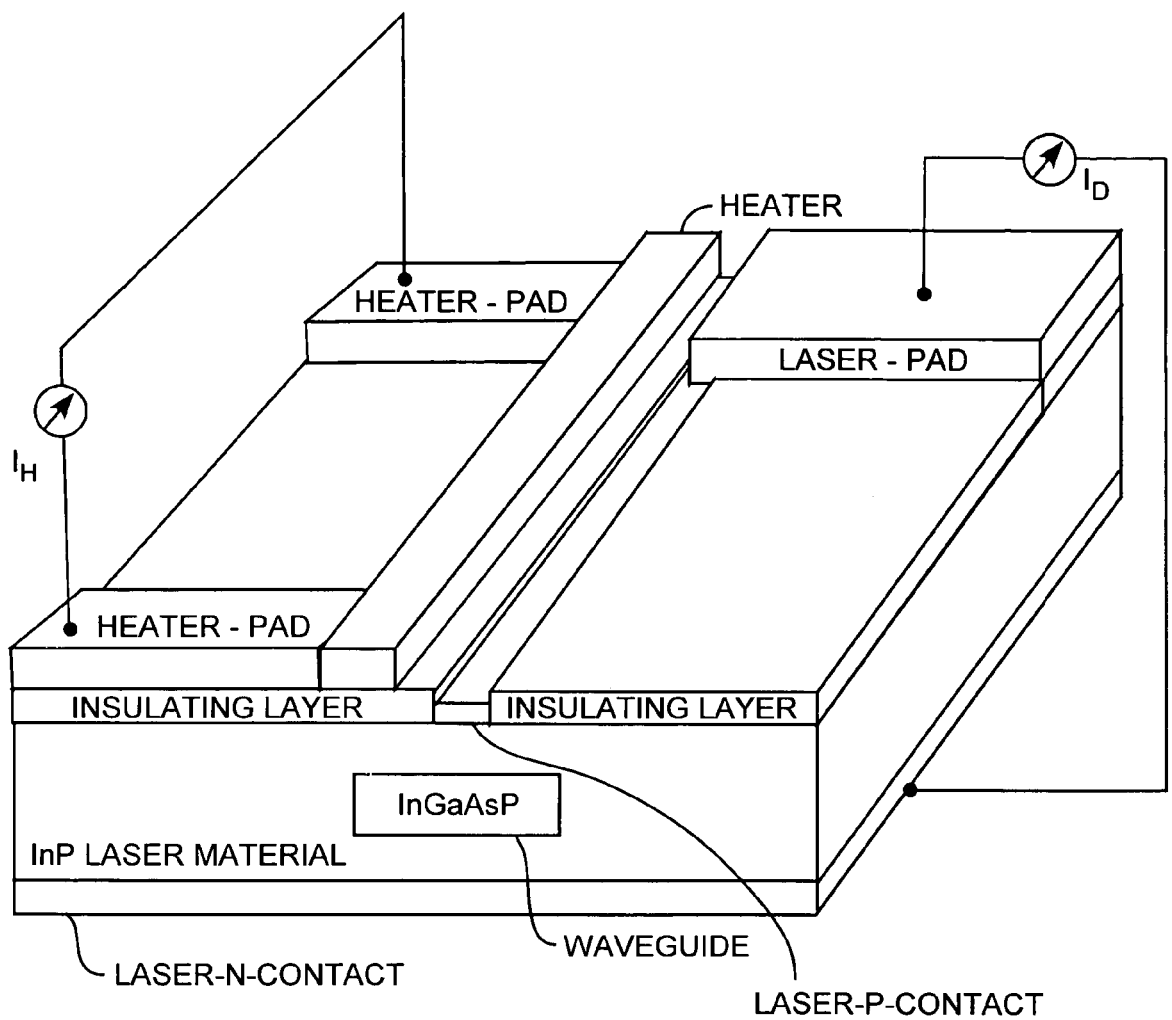
FIG. 1 depicts a focused ion beam heater thermally tunable laser.

An embodiment of the invention is described with reference to the figures using reference designations as shown in the figures. Referring to FIG. 1, a focused ion beam heater thermally tunable laser is preferably made using metal organic chemical vapor deposition (MOCVD) to grow laser epitaxial structures and using semiconductor fabrication processes. An active region or waveguide is formed in the laser structure for generating photons and guiding light. An insulating layer, in this case silicon dioxide film, is deposited on the top surface of lasers. An opening or channel is introduced in the insulating layer to form P-ohmic contact, which is subsequently connected to a laser pad. A thin film heater and two heater pads are deposited on the insulating layer. Two heater pads are used for flowing currents through the heater using a heater current ($I_H$). A laser diode current ($I_D$) flows between the laser pad and the laser N-ohmic contact. The $I_D$ current is used to conduct current through the laser P-ohmic contact and the laser N-ohmic contact for generating photons in the active region by population inversion that then propagate along the waveguide.

The heater is preferably made of a thin Platinum (Pt) film that is deposited by a focused ion beam process as heater strips or tuning elements in thermally tunable 1.3 μm InGaAsP/InP DFB lasers. A focused ion beam (FIB) system, not shown, but of conventional use, uses a beam of ions that is scanned across the sample. The ion beam is ejected from a liquid metal Ga ion source with a typical spot size of less than 10 nm at the source. The use of ions as the scanned species makes possible direct etching of material in selected regions as well as localized deposition of metal structures such as Pt. For example, a 30 keV FEI Model FIB 610 focused ion beam system operating at 25 kV and equipped with a glass ion column can be employed to deposit Pt thin films for heater strips as well as contact pads. A Pt deposition by FIB requires setting several parameters that need to be controlled in depositing Pt films including beam current and scan speed, such as dwell time per pixel and beam overlap. The FIB deposition is a delicate process between decomposing the absorbed gas to produce a conductive layer and sputtering material from the sample surface. The depositions can be performed using ion currents of 1 nA. The ion flux can be used to crack a commercially available platinum precursor, methylcyclopentadienyl(trimethyl)platinum or MeCpPt(Me)$_3$. The Pt precursor is located in a gas injection system and an injector can be placed above the sample. The deposition process entails the cracking of the precursor by the ion beam, depositing platinum films locally only at the location bombarded by the beam. Thus, the process is a mask-less process. One of the key parameters available for controlling the resistance of these Pt films is the ion beam dwell time on each pixel, and a dwell time of 0.2 μsec can be used. Electrical resistances measured from Pt strips can differ with different lengths and widths. A FIB Pt heater can be used as a very efficient tuning element for DFB lasers because of the fact that exceptionally high electrical resistances can be measured from FIB deposited Pt thin films with suitable dimensions. The Pt thin films can be 5000 Å thick. The electrical resistances can be measured from various test patterns deposited on a test 300 nm thick silicon nitride film with different widths and lengths. The pad size may be 60×60 μm$^2$. A high resistance value of 1150Ω corresponding to a resistivity of 104Ω-μm can be obtained from an 18 μm wide and 100 μm long strip, which is very useful for thermal tuning. This high electrical resistance obtained from these films is due to the incorporation of a large amount of carbon from the precursor species, which has been verified by studying depth profiles of Pt films using secondary ion mass spectrometry (SIMS).

Laser technology used for the present art is the antireflection (AR) and high-reflection (HR) coated InGaAsP/InP planar buried hetero-structure DFB laser with a multiple quantum well active layer. However, the process can be equally applied to ridge waveguide type DFB lasers as well and also to DFB lasers based on different material systems including (In)GaAs/AlGaAs, (In)GaAs/InGaP, InGaP/Al(In)GaP, InGaAs/AlIn(Ga)As,and InGa(As)Sb/AlGa(As)Sb. The tunable laser manufacturing process can use the FIB Pt deposition to introduce a strip heater and pads to the top surface of completed DFB lasers. The laser cavity may be 450 μm long, and the Pt heater strip may be 18 μm wide and 430 μm long. The separation between the heater strip and the active region may be about 15 μm.

Figure 3:
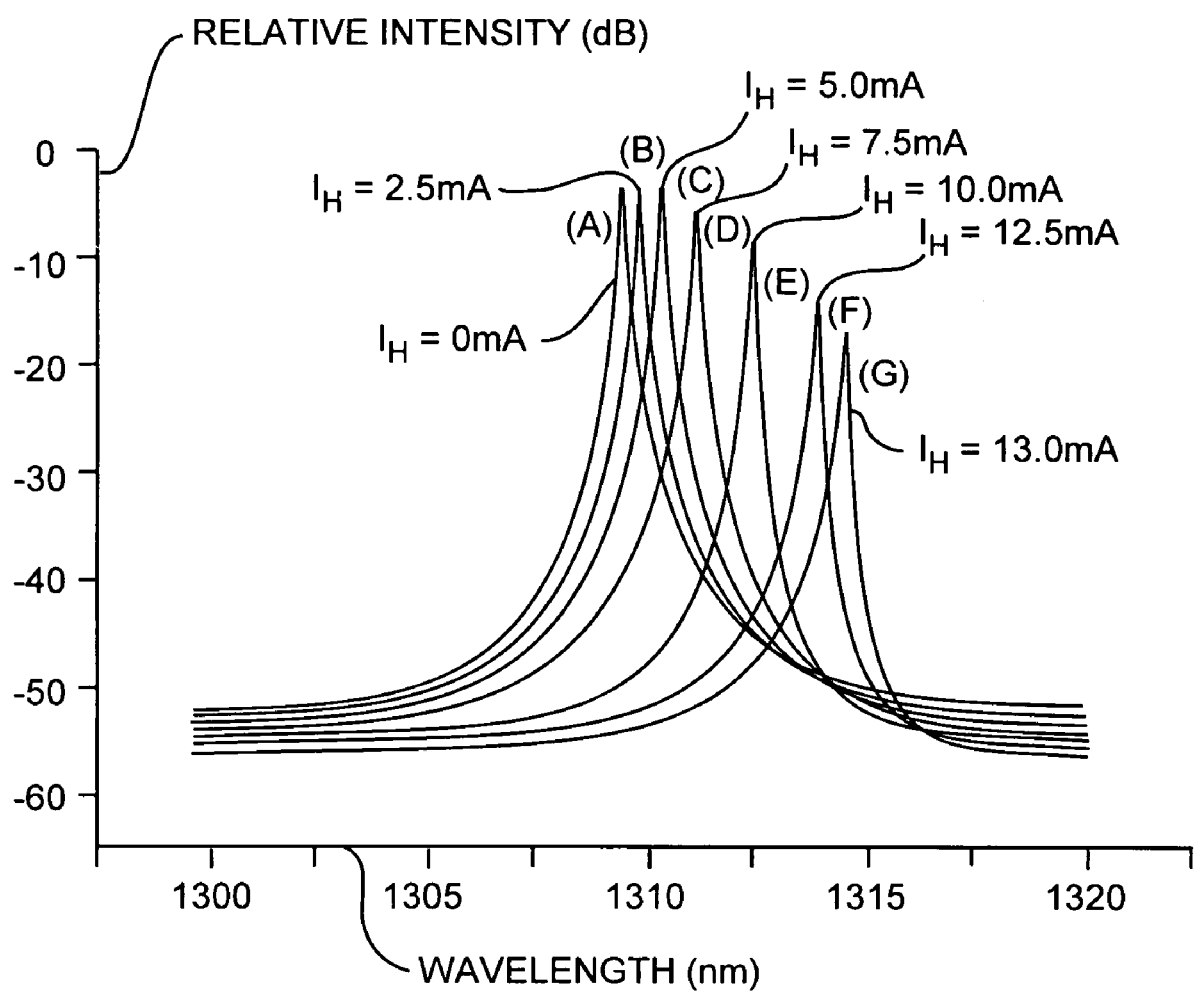
FIG. 3 is a heater current dependent thermally tunable laser emission spectra plot.

The following technical merits were obtained from the Pt heater integrated DFB laser. A continuous wave laser threshold current with no heater current at 15° C. was 12 mA, and the lasing wavelength was 1309.5 nm at 50 mA or 27 mW of optical power. The side-mode-suppression-ratio was over 40 dB. FIG. 3 shows the emission spectra from the Pt heater integrated DFB laser with an 18 μm wide and 430 μm long Pt strip measured at 15° C. with different heater currents. As the heater current increased from 0 to 13 mA, the lasing wavelength shifted from 1309.5 nm to 1314.4 nm, the red shift being typical of thermal tuning. Because the heater current of 13 mA corresponds to heater power of 836 mW, the tuning efficiency is 5.9 nm/W. Assuming the same wavelength tuning of 4.9 nm at 1.55 μm, this laser can cover 10 channels in dense wavelength division multiplexing (DWDM) system with a channel spacing of 0.8 nm or 100 GHz.

Figure 2:
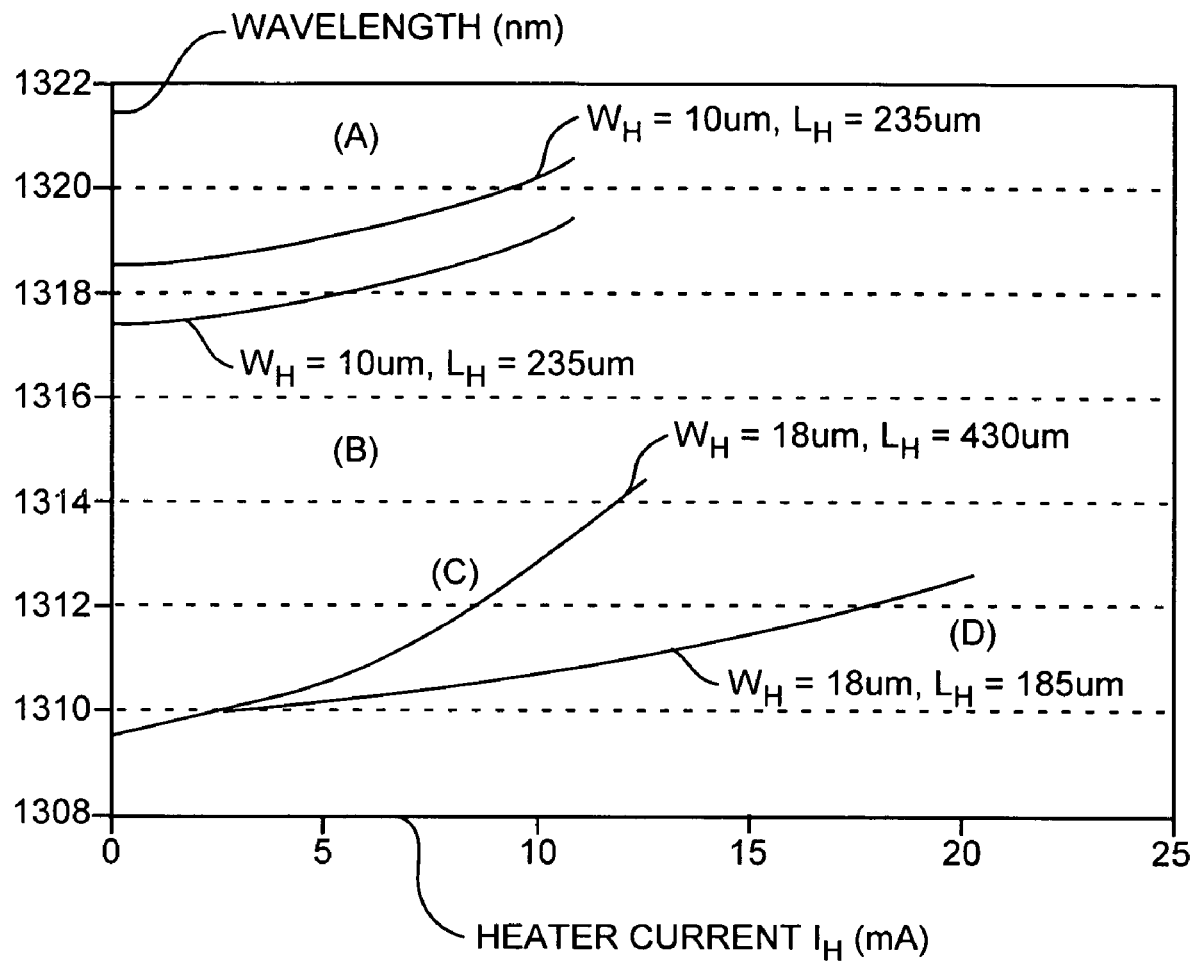
FIG. 2 is a heater dimension and heater current dependent wavelength tuning plot.

Referring to FIG. 2, lasing wavelengths or tuning characteristics were measured with different heater currents from the integrated lasers with different heater widths $W_H$ (10 μm for (A) and (B), and 18 μm for (C) and (D)) and lengths $L_H$ (235 μm for (A) and (B), 430 μm for (C), and 185 μm for (D)). The tuning efficiency improves from 3.5 to 5.9 nm/W as the heater length increases from 185 to 430 μm for the same heater width of 18 μm.

Referring to FIG. 3, a set of emission spectra were measured at 15° C. with different heater currents from the Pt heater integrated DFB laser. For setting at (A), (B), (C), and (D) the intensity remained relative constant as the laser wavelength was accordingly tuned to respective wavelengths. The intensity began to fall off at high current for (E), (F), and (G) for currents 10.0 mA, 12.5 mA and 13.0 mA, respectively, as shown.

Figure 4:
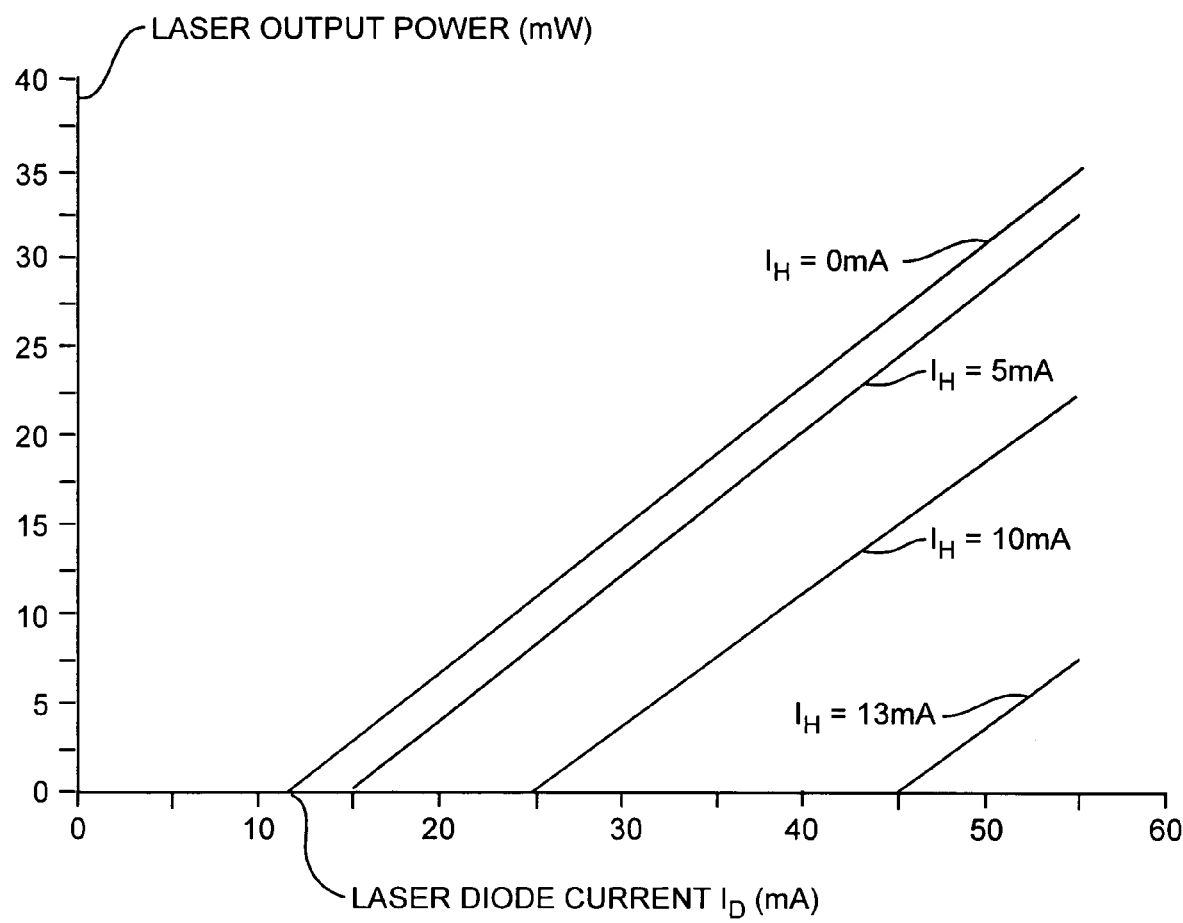
FIG. 4 is a heater current dependent laser diode current-output power plot.

Referring to FIG. 4, the laser output power was measured against the laser diode current at various heater currents $I_H$ of 0 mA, 5 mA, 10 mA and 13 mA.

The invention is directed to a thermally tunable laser with focused ion beam deposited Pt thin film heaters as tuning elements. A metal-organic precursor is used as a source material for depositing thin metal films having a large number of carbons. This impurity is for providing high resistivity of the film that enables good thermal tuning of the laser. The Pt film is deposited by FIB process. The main applications of the tunable lasers are datacom and telecom, but the 1.3 μm tunable lasers can also be used in tunable diode laser absorption spectroscopy as water sensors because H$_2$O molecules have strong absorption bands at this wavelength region. Those skilled in the art can make enhancements, improvements, and modifications to the invention, and these enhancements, improvements, and modifications may nonetheless fall within the spirit and scope of the following claims.

What is claimed is:

1. A tunable laser for generating a laser light over a laser bandwidth, the laser comprising, a heater for conducting a heater current for generating heat for heating the laser over a heat range, the heater is made of an organometalic material comprising a metal and an organic material, and a laser material, the laser material conducting a laser current for generating the laser light over the laser bandwidth, the wavelength of the laser light changing over the laser bandwidth over the heat range, wherein the laser is a semiconductor device and the heater is deposited on the semiconductor by a focused ion beam, the laser controlled by an external heater current source for providing the heater current and controlled by an external laser current source for providing the laser current, the laser further comprising, a first portion of an insulating layer for isolating the heater from the laser material, a pair of heater pads disposed on the first portion for conducting the heater current though the heater, a laser pad for conducting the laser current, a laser p contact disposed on the laser material and connected to the laser pad, a laser n contact disposed on the laser material, the laser p contact and laser n contact for conducting the laser current through the laser material, and a waveguide disposed in the laser material, the waveguide for collecting and propagating the laser light, wherein, the laser bandwidth is 857 GHz, and the heater current is between zero and 13.0 mA.

2. The laser of claim 1 wherein, the metal is platinum, and the organic material is carbon.

3. The laser of claim 1 wherein, the laser material is InP, and the waveguide is made of InGaAsP.

4. The laser of claim 1 wherein, the laser light has a wavelength of 1309.5 nm at a laser heater current of zero.

5. The laser of claim 1 wherein, the laser light has a wavelength of 1314.4 nm at a laser heater current of 13.0 mA.

6. A tunable laser for generating a laser light over a laser bandwidth, the laser comprising, a heater for conducting a heater current for generating heat for heating the laser over a heat range, the heater is made of an organometalic material comprising a metal and an organic material, and a laser material, the laser material conducting a laser current for generating the laser light over the laser bandwidth, the wavelength of the laser light changing over the laser bandwidth over the heat range, wherein the laser is a semiconductor device and the heater is deposited on the semiconductor device by a focused ion beam, the laser further comprising, a first portion of an insulating layer for isolating the heater from the laser material, and a pair of heater pads disposed on the first portion for conducting the heater current through the heater where the heater current is between zero and 13.0 mA.

7. The laser of claim 6 further comprising, a waveguide for collecting and propagating the laser light, the waveguide disposed in the laser material.

8. The laser of claim 6 further comprising, a laser current source for generating the laser current.

9. The laser of claim 6 further comprising, a heater current source for generating the heater current.

10. The laser of claim 6 wherein, the metal is platinum, and the organic material is carbon.

11. The laser of claim 6 wherein, the laser material is InP.

12. The laser of claim 6 wherein, the laser bandwidth is 857 GHz.

13. The laser of claim 6 wherein, the laser light has a wavelength of 1309.5 nm at a laser heater current of zero, and the laser light has a wavelength of 1314.4 nm at a laser heater current of 13.0 mA.

\* \* \* \* \*